United States Patent [19]
Nakayama et al.

[11] Patent Number: 5,966,787
[45] Date of Patent: *Oct. 19, 1999

[54] PROCESS FOR PRODUCING A PROBE-DRIVING MECHANISM

[75] Inventors: Masaru Nakayama, Atsugi; Yutaka Hirai, Tokyo; Takayuki Yagi, Machida; Yuji Kasanuki, Isehara; Keisuke Yamamoto, Yamato; Yasuhiro Shimada; Yoshio Suzuki, both of Atsugi, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/646,551

[22] Filed: May 8, 1996

Related U.S. Application Data

[62] Division of application No. 08/193,777, Feb. 10, 1996, abandoned, which is a continuation of application No. 07/888,833, May 27, 1992, abandoned.

[30] Foreign Application Priority Data

May 30, 1991 [JP] Japan .................................... 3-153775
May 20, 1992 [JP] Japan .................................... 4-151257

[51] Int. Cl.⁶ .................................................. H01L 41/22
[52] U.S. Cl. ......................... 29/25.35; 310/328; 310/332
[58] Field of Search ........................... 29/25.35; 310/311, 310/321, 324, 328, 330–332, 357–359, 366; 156/654.1, 657.1; 216/27

[56] References Cited

U.S. PATENT DOCUMENTS

| | | | |
|---|---|---|---|
| 4,642,508 | 2/1987 | Suzuki et al. | 310/321 |
| 4,668,865 | 5/1987 | Gimzewski et al. | 250/306 |
| 4,702,418 | 10/1987 | Carter et al. | 310/328 X |
| 4,751,774 | 6/1988 | De Young et al. | 310/328 X |
| 4,766,671 | 8/1988 | Utsumi et al. | 427/97 |
| 4,783,821 | 11/1988 | Muller et al. | 310/324 X |
| 4,906,840 | 3/1990 | Zdeblick et al. | 250/306 |
| 5,034,645 | 7/1991 | Woodruff et al. | 310/332 X |
| 5,049,775 | 9/1991 | Smits | 310/332 X |
| 5,128,544 | 7/1992 | Iwatsuki | 310/328 X |
| 5,138,216 | 8/1992 | Woodruff et al. | 310/330 X |
| 5,160,870 | 11/1992 | Carson et al. | 310/324 X |
| 5,162,691 | 11/1992 | Mariani et al. | 310/332 X |
| 5,173,605 | 12/1992 | Hayes et al. | 250/306 |
| 5,436,523 | 7/1995 | Staudte | 310/348 |

FOREIGN PATENT DOCUMENTS

| | | |
|---|---|---|
| 63-161552 | 7/1988 | Japan . |
| WO89/07256 | 8/1989 | WIPO . |

Primary Examiner—S. Thomas Hughes
Attorney, Agent, or Firm—Fitzpatrick, Cella, Harper & Scinto

[57] ABSTRACT

A process for producing a probe-driving mechanism. A laminate of a first and second insulating layer is placed on a support. Electrode layers and piezoelectric layers are successively laminated on the second insulating layer. Part of the support and second insulating layer is removed to form a cantilever.

6 Claims, 7 Drawing Sheets

PROCESS FOR PRODUCING A PROBE-DRIVING MECHANISM

This application is a division of application Ser. No. 08/193,777 filed Feb. 10, 1994, now abandoned, which is a continuation of application Ser. No. 07/888,833 filed May 27, 1992, now abandoned.

BACKGROUND OF THE INVENTION

1. Field of the Invention

The present invention relates to a piezoelectric actuator, a probe-driving mechanism, methods of production thereof, and an apparatus employing the same such as a tunnel current-detecting device and an information-processing device.

2. Related Background Art

In recent years, application of STM technique is investigated in a variety of technical fields including observation and evaluation of semiconductors and high-molecular materials in atomic or molecular order, fine working, and recording apparatus.

In particular, recording apparatuses are required to have large capacity in calculation information and image information of a computor, and so forth, and development of STM technique therefor is more and more strongly demanded. As the result of progress in semiconductor processing technique, microprocessors have come to be miniaturized and computing ability has been improved. Consequently, recording apparatuses are desired to be further miniaturized. To satisfy such requirements, a recording-reproduction apparatus is disclosed which employs a transducer having a tunnel-current-generating probe provided on a driving means capable of fine adjustment of the gap between the probe and a recording medium. This apparatus records information by applying voltage with the transducer to change the work function on the surface of the recording medium, or reads out information by detecting the change of a tunnel current caused by the change of the work function, at the minimum recording area of 10 nm square (Japanese Patent Application Laid-Open No. 63-161552).

Generally, the probes need to be increased in number in order to accelerate transfer and recording of data. In the transfer or recording of data in the aforementioned apparatus, the probes run along the lines of recorded data by adjusting the space between the probe and a recording medium. Since the breadth of the lines of the recorded data is extremely small, stable recording-reproduction cannot readily be achieved owing to the drift caused by the temperature variation of the apparatus, run-out of the probes from the data lines caused by external vibration, and other influences. Accordingly, the respective probes are required to move independently in high speed in a direction perpendicular to the face of the recording medium.

To satisfy such requirement, WO89/07256, for example, discloses a cantilever constituted of lamination of piezoelectric material layers 5, 7 and electrode layers 4, 6, 8 as shown in FIG. 6. The cantilever is prepared by forming an insulating layer 11 composed of silicon oxide film, patterning it, and etching anisotropically a substrate 1 to have a bimorph arm 10.

In the above example of the prior art, however, the thickness of the insulating layer 11 needs to be made thin to suppress side-etching of the Si substrate 1 in the etching of the bimorph arm 10 and the insulating layer 11. Thereby, nonnegligible capacitance is induced between the lower electrode 4 and the Si substrate 1, forming an equivalent circuit by connection with another electrode through the substrate as shown in FIG. 7.

Usually, the driving frequency of a cantilever is limited by the resonance frequency determined by the dimension and the layer constitution of the cantilever. In the example of the above prior art, the driving frequency is limited also by the increase of the time constant caused by the capacitance induced by the piezoelectric substance layers 5, 7 and the aforementioned parasitic capacitance. Consequently, the adjustment of the spacing between a medium and the probe becomes impossible and malfunction arises in writing and reading. In a multi-probe construction, difference in lengths of wiring to the driving electrodes for respective probes causes large variation of the parasitic capacitance, which causes variation of the driving characteristics of the cantilever.

If the insulating layer under the electrode is made thick to reduce the parasitic capacity for the purpose of avoiding the above problems, Si is isotropically etched, when the insulating layer 11 is etched, in the side direction in a dimension of ten times larger or more than the thickness of the insulating layer as shown in FIG. 6, which lowers the controllability of the cantilever.

SUMMARY OF THE INVENTION

An object of the present invention is to provide a novel piezoelectric actuator and a probe-driving mechanism, in which the parasitic capacitance induced between the cantilever and the support is reduced to improve the responsibility of the cantilever and unnecessary etching is prevented, and also to provide a method of production thereof.

Another object of the present invention is to provide an information processing apparatus comprising a tunnel current-detecting device employing the above probe-driving mechanism improved in accuracy and responsibility, and means for recording, reproduction, and erasing.

According to a first aspect of the present invention, there is provided a probe-driving mechanism comprising a bimorph cantilever having a thin piezoelectric substance film and electrodes holding the film therebetween and being supported by a support at one end, and having a probe for information input and output at the other end: the probe-driving mechanism having a first insulating layer between the support and the cantilever, and a second insulating layer at the other side of the support, and the first insulating layer having a sufficient thickness to reduce parasitic capacitance induced between the electrode of the cantilever and the support.

According to a second aspect of the present invention, there is provided a process for producing a probe-driving mechanism, comprising steps of providing a first insulating layer on a support, providing a second insulating layer on the other side of the support, laminating an electrode layer and a thin piezoelectric substance layer successively on the first insulating layer, forming a probe, and removing the support to form a cantilever.

According to a third aspect of the present invention, there is provided a multi-probe-driving mechanism, having two or more of the above probe-driving mechanism arranged two-dimensionally.

According to a fourth aspect of the present invention, there is provided a tunnel current-detecting apparatus, comprising the above prove-driving mechanism counterposed to an electric conductor, a driving means for driving the probe-driving mechanism, a control means for controlling the driving means, a voltage-applying means for applying voltage between the electric conductor and the probe, a detecting means for detecting a tunnel current between the electric conductor and the probe, and an outputting means for outputting information on the surface of the electric conductor according to detected tunnel current.

According to a fifth aspect of the present invention, there is provided an information-processing apparatus, comprising the above probe-driving mechanism counterposed to a recording medium, a driving means for driving the probe-driving mechanism, a control means for controlling the driving means, and a voltage applying means for applying pulse voltage between the recording medium and the probe for information recording.

According to a sixth aspect of the present invention, there is provided an information-processing apparatus, comprising the above prove-driving mechanism counterposed to a recording medium, a driving means for driving the probe-driving mechanism, a control means for controlling the driving means, and a voltage applying means for applying bias voltage between the recording medium and the probe for information reproduction.

According to a seventh aspect of the present invention, there is provided an information-processing apparatus, comprising the above prove-driving mechanism counterposed to a recording medium, a driving means for driving the probe-driving mechanism, a control means for controlling the driving means, and voltage-applying means for applying pulse voltage for information recording and applying bias voltage between the recording medium and the probe for information reproduction.

In the above-mentioned three aspects of the present invention with regard to information-processing apparatus, a surface of the recording medium may be non-conductive.

According to an eighth aspect of the present invention, there is provided a piezoelectric actuator, comprising a bimorph cantilever having a thin piezoelectric substance film and electrodes holding the film therebetween and being supported at an end by a support; a first insulating layer between the cantilever and the support; and a second insulating film on the other side of the support, and the first insulating layer having a sufficient thickness to reduce parasitic capacitance induced between the electrode of the cantilever and the support.

According to an ninth aspect of the present invention, there is provided a process for producing a piezoelectric actuator, comprising steps of providing a first insulating layer on a support, providing a second insulating layer further thereon, laminating an electrode layer and a thin piezoelectric substance layer successively on one of the insulating layers, and removing the support to form a cantilever.

DESCRIPTION OF THE PREFERRED EMBODIMENT

In the present invention, the rigidity of the cantilever portion is lowered and the insulating layer on the substrate is made thick, whereby the parasitic capacitance is lowered and the driving characteristics of the cantilever is improved.

The insulating layer has preferably a thickness of at least 5000 Å, more preferably 1 $\mu$m or more.

The present invention is described specifically by reference to examples.

EXAMPLE 1

Figure 1:
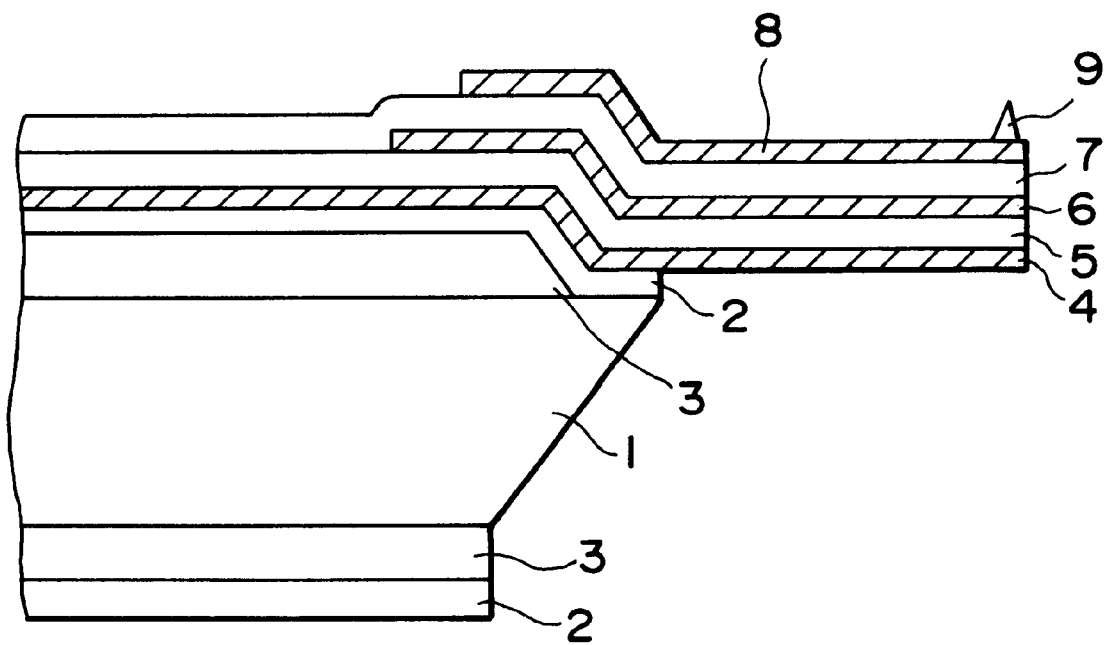
FIG. 1 is a sectional view of a probe-driving mechanism of the present invention.

FIG. 1 is a sectional view of a constitution of a cantilever and leader electrodes. The cantilever portion is constituted of a piezoelectric material layer 5, 7 and driving electrode layers 4, 6, 8. At the free end of the cantilever, a tip 9 is provided. The electrode for leading out the tunnel current is formed simultaneously with the formation of the upper electrode 8. The intermediate and upper electrodes 6, 8 are wired over a long distance practically to a bonding pad, although they are shown to be cut in the drawing.

Figure 2A:
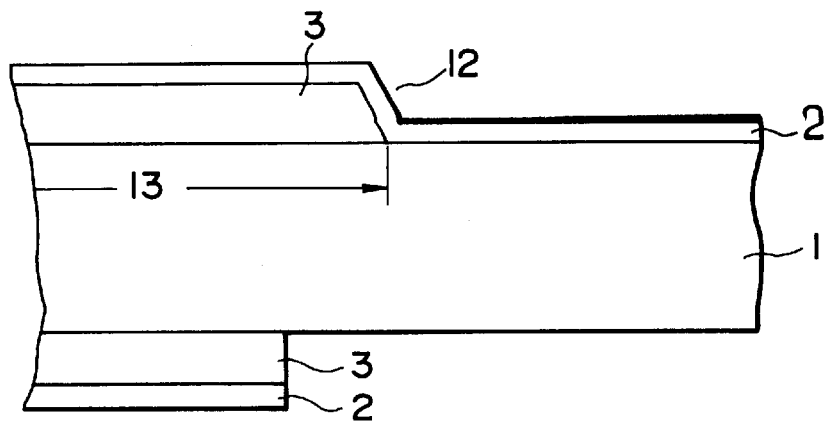
FIGS. 2A to 2C illustrate a process for producing a probe-driving mechanism.
Figure 2B:
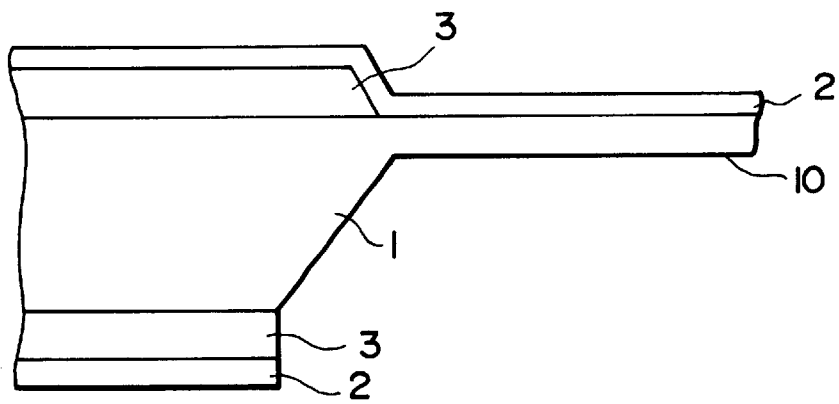
Figure 2C:
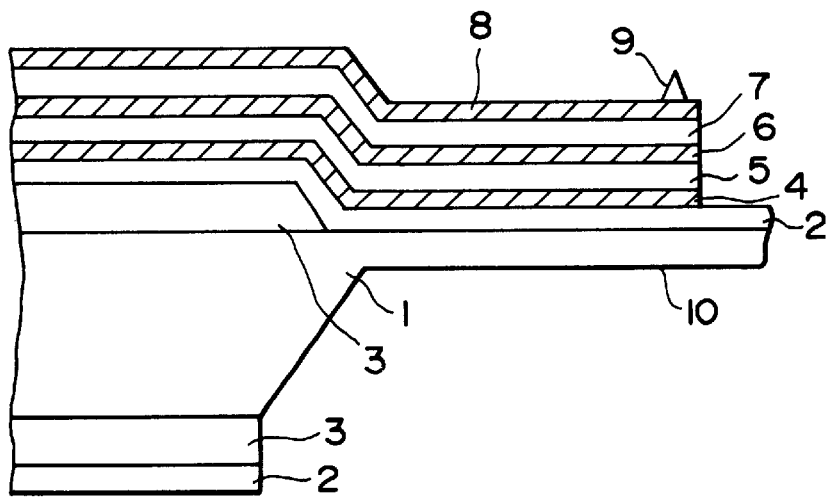

The constitution and the effect of the present invention are described by reference to the drawing of a production flow in FIGS. 2A to 2C. As shown in FIG. 2A, since a thick film can readily be formed on a (100) Si substrate 1, silicon oxide films 3 are formed thereon in a thickness of 1 $\mu$m or more in a thermal oxidation furnace. The both faces are subjected to patterning. In the patterning, the silicon oxide films on the both surfaces are left remaining only on the supporting portion 13. The patterning of the silicon oxide film 3 is conducted preferably by isotropic etching with an aqueous HF solution or the like because the coverage of the lower electrode 4 to be formed later will become insufficient if the end of the edge portion 12 of the silicon oxide film is steep and the lower electrode 4 to be formed in the step of FIG. 2C is relatively thin. Thereafter, silicon nitride films 2 are formed in a thickness of from 1000 to 1500 Å by vapor growth of an $SiH_2Cl_2$ gas and an $NH_3$ gas, and the film at the back side only is patterned. Instead of formation of the silicon nitride films, silicon oxide films may be formed again by means of a thermal oxidation furnace. Subsequently, etching is conducted by anisotropic etching of Si substrate 1, for example by heating with an aqueous KOH, at the region of the cantilever portion to form an Si membrane 10 of several ten $\mu$m thick as shown in FIG. 2B. Thereafter, a lower electrode 4 of about 1000 Å thick and a piezoelectric material layer 5 are formed as shown in FIG. 2C. In the same manner, an intermediate electrode 6, another piezoelectric material layer 7, and an upper electrode 8 are laminated in this order. Further thereon, a tip 9 is formed. After the resulting matter is coated in a thickness of 10 $\mu$m or more, the Si membrane 10 and the silicon nitride film are removed by anisotropic etching with an aqueous KOH solution or the like or by plasma etching with a gas such as $CF_4$ and $SF_6$. Further the coating is removed off by plasma etching with a gas such as $CF_4$ and $SF_6$. Thus a cantilever having constitution as shown in FIG. 1 is obtained.

The advantage of the above constitution of the present invention are as below. In the traditional constitution of FIG.

Figure 7:
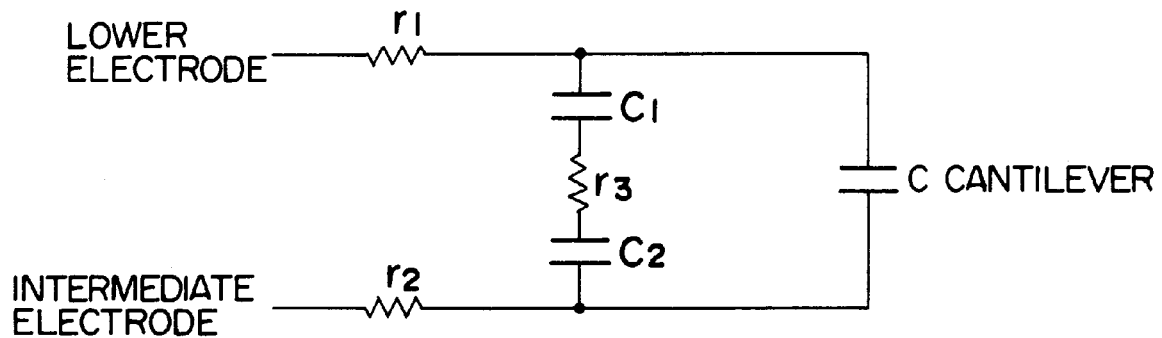
FIG. 7 illustrates an equivalent circuit between the electrodes.

6, as described above, undesired parasitic capacitances, $c_1$ and $c_2$, are induced as shown in the equivalent circuit shown in FIG. 7, where c denotes the capacitance of the piezoelectric material; $r_1$ and $r_2$ denote resistances of wiring; and $r_3$ denotes the resistance of the substrate.

Figure 6:
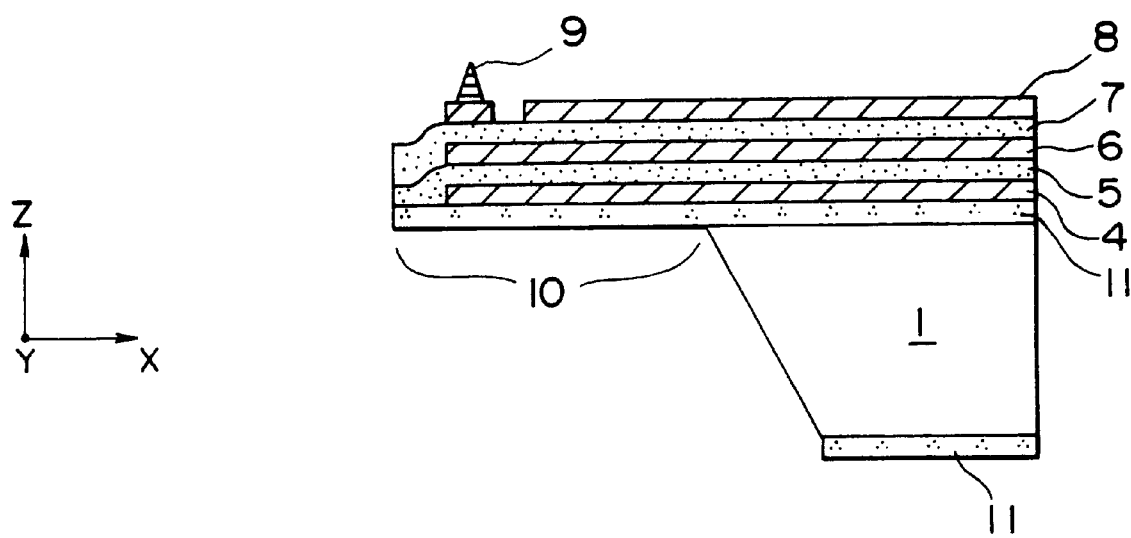
FIG. 6 illustrates roughly an example of prior art.

The values of c, $c_1$, and $c_2$ of the present invention (FIG. 1) are compared with the ones of prior art (FIG. 6) under the conditions below.

| Conditions | |
|---|---|
| Thickness of $SiO_2$, 3 (Present invention) | 1 μm |
| Thickness of $Si_3N_4$, 2 (Insulating layer in prior art) | 0.15 μm |
| Thickness of piezoelectric material layer, 5, 7 | 0.3 μm |
| Dimension of cantilever 9 | 300 μm × 100 μm |
| Wiring | 5 μm wide × 5 mm long |
| Dielectric constant of $Si_3N_4$ | $1.0 \times 10^{-11}$ (F/m) |
| Dielectric constant of $SiO_2$ | $3.5 \times 10^{-11}$ (F/m) |
| Dielectric constant of ZnO | $1.1 \times 10^{-10}$ (F/m) |

| Parasitic capacitance | Prior art | Present invention |
|---|---|---|
| c | 11 pF | 11 pF |
| $c_1$ | 16.5 pF | 0.7 pF |
| $c_2$ | 5.9 pF | 0.7 pF |
| c' | 4.3 pF | 0.4 pF |
| (c' being the total of $c_1$ and $c_2$) | | |

Figure 4:
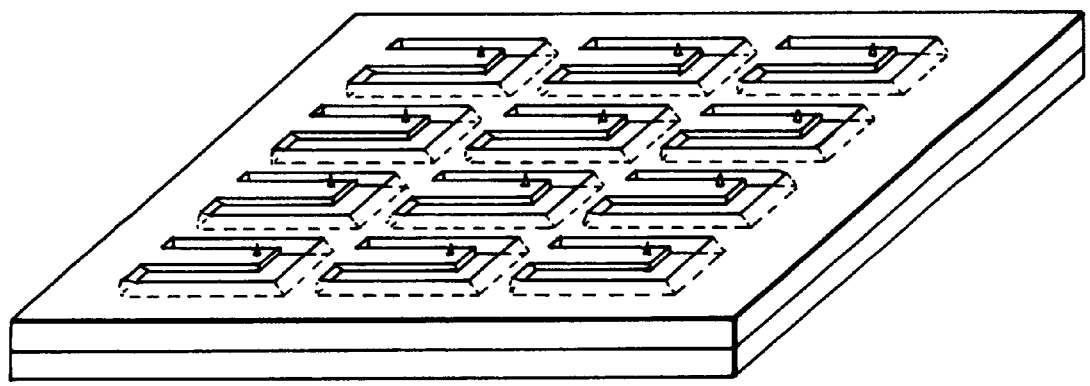
FIG. 4 is a rough sketch of a multi-probe.

As shown above, in the cantilever of prior art, the ratio of the parasitic capacitance to the capacitance of the main body of the cantilever (c'/c) is about 40%, while the value of c' of the present invention is as low as 1/10 or lower thereof. In the case of a multi-probe shown in FIG. 4, the wiring length differs among the probes, which causes large differences in the parasitic capacitances of the probes and in the resistance of the substrates, thus causing variation in cantilever driving. On the contrary, in the cantilever of the present invention, the variation of the parasitic capacitance caused by the variation of length of the wiring is reduced because the parasitic capacitance is low. In other words, the present invention enables reducing greatly the variation of the characteristics among the respective cantilever.

EXAMPLE 2

Figure 3:
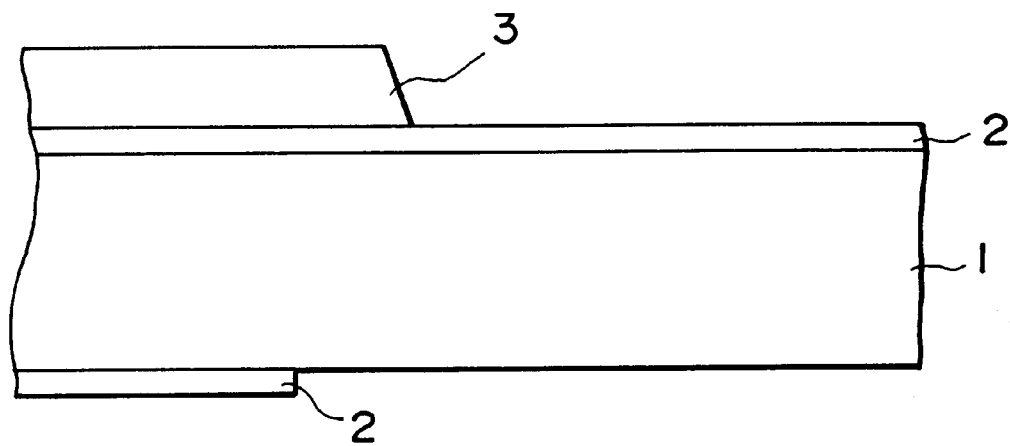
FIG. 3 illustrates another process for producing a probe-driving mechanism of the present invention.

Another process for the production of a cantilever in described below by reference to FIG. 3. The basic constitution and effects of this Example are the same as those in Example 1.

On both faces of an Si substrate 1, respectively silicon nitride films 2 are formed by reaction of $SiH_2Cl_2$ and $NH_3$ at about 800° C. in a thickness of from 100 to 1500 Å by means of an LPCVD apparatus. The silicon nitride film on the back side is subjected to patterning and etching for formation of an Si membrane region 10. Then a silicon oxide film 3 is formed only at the front face by reaction of $SiH_4$ and $O_2$ by means of a normal-pressure CVD apparatus, and the resulting film is patterned and etched to obtain constitution as shown in FIG. 3. The subsequent procedure is the same as in Example 1.

Incidentally, the same result is obtained by forming the Si membrane 10 before the formation of the silicon oxide film 3.

EXAMPLE 3

Figure 5:
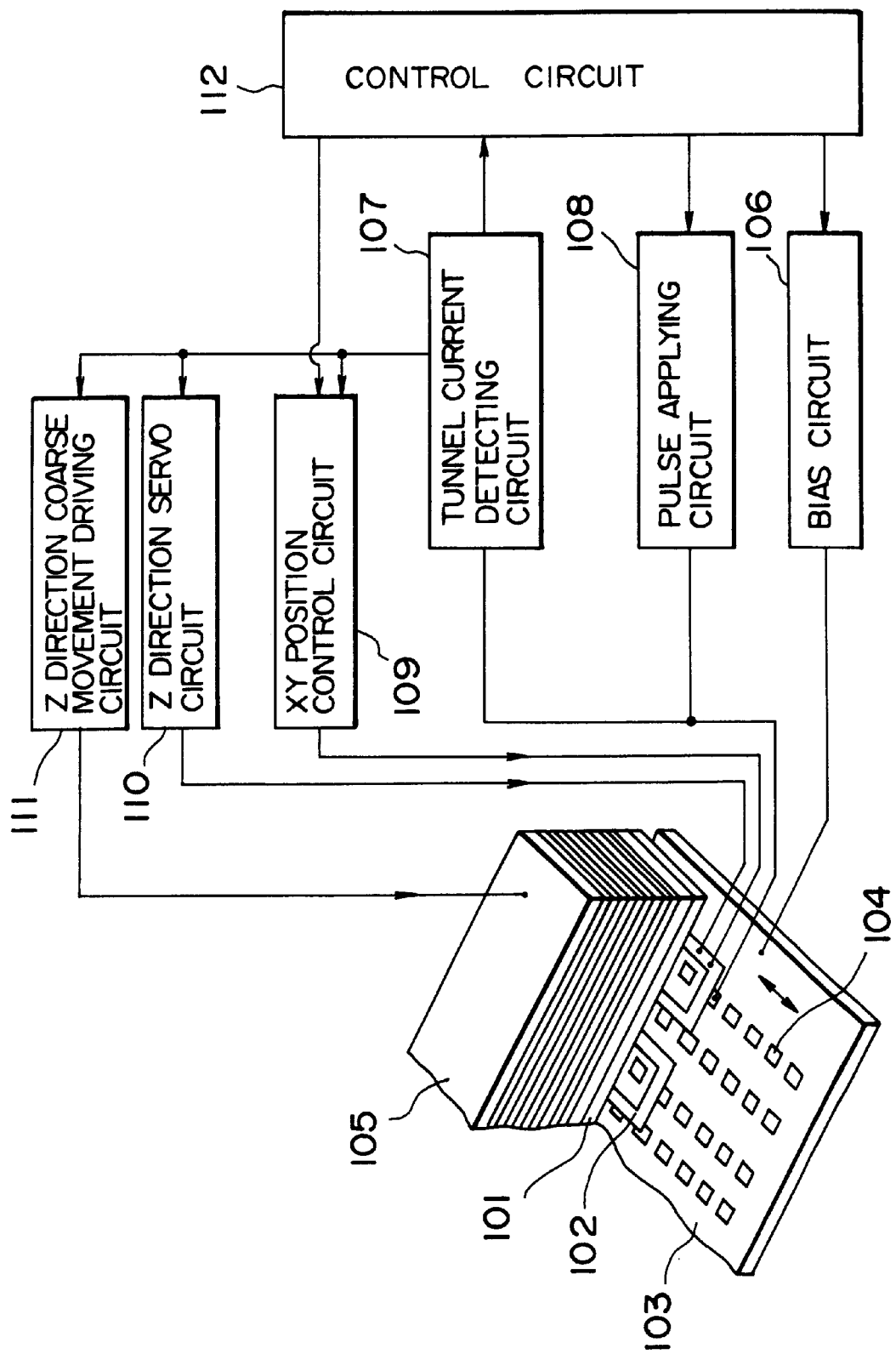
FIG. 5 illustrates outline of an information-processing apparatus of the present invention.

A recording-reproducing apparatus which employs the above probe-driving mechanism is described below as an example of the information-processing apparatus of the present invention. FIG. 5 illustrates roughly a recording-reproducing apparatus of the present invention. On a silicon substrate 101, the probe-driving mechanism 102 of the present invention is provided in plural numbers. A piezoelectric element 105 for coarse driving drives the silicon substrate in the Z direction. The numeral 103 denotes a plate-shaped recording medium. Data lines 104 are formed by arranging, in lines, recording areas determined by a scannable region of the probe-driving mechanism. The recording medium 103 is moved by a movement mechanism, not shown in the drawing, in parallel in a direction indicated by the arrow mark in the drawing, and information is written into the recording areas in lines. The probe-driving mechanism 102 and the piezoelectric element 105 for Z-direction coarse-driving are constituted so as to be movable in a direction perpendicular to the data lines by means of a movement mechanism such as a linear motor not shown in the drawing. Thereby any desired data line is accessed to record and reproduce the data. The access to the desired data line is conducted by a position-detecting device such as a linear encorder. Thereafter, each of the probes of the probe-driving mechanism 102 scans the respective recording areas of the intended data lines.

Figure 8:
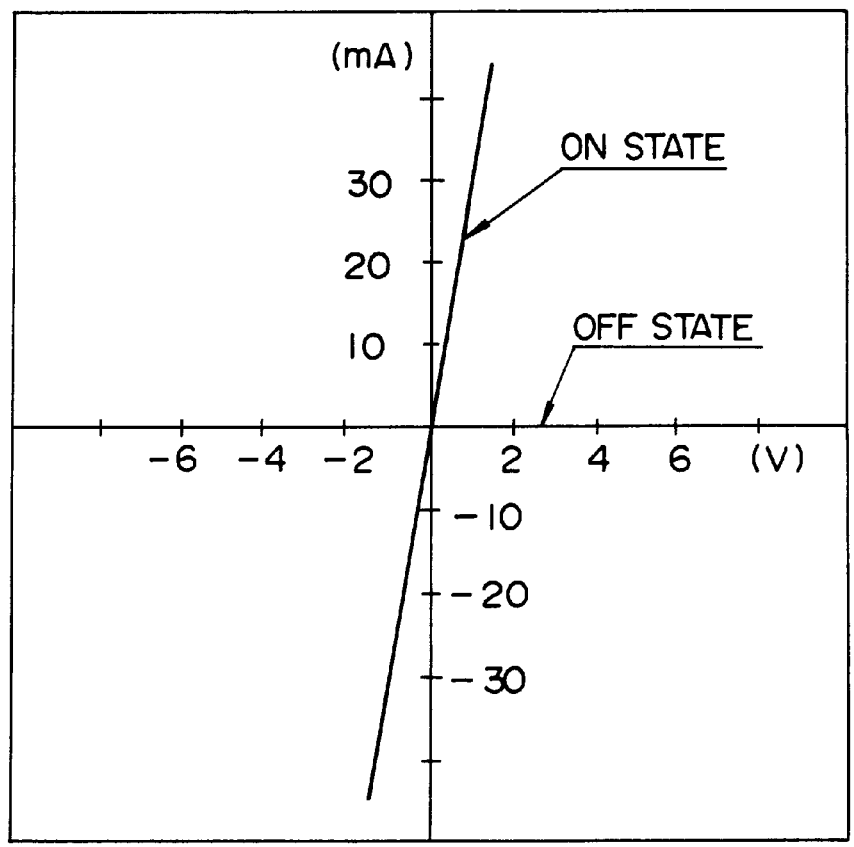
FIG. 8 illustrates an electric memory effect of a recording layer employed in an information-processing apparatus of the present invention.

The recording layer 103 may be made of a material exhibiting a memory-switching phenomenon (or electric memory effect) in current-voltage characteristics, such as an organic monomolecular film or a built-up film thereof prepared by laminating on an electrode molecules comprising both a group having a π electron level and a group having only a σ electron level as described in Japanese Patent Application Laid-Open No. Sho-63-161552. The electric memory effect enables reversible transition (or switching) between two or more electroconductive states (ON state and OFF state in FIG. 8), namely a low-resistance state (ON state) and a high-resistance state (OFF state) of a thin film such as the aforementioned organic monomolecular film or a built-up film thereof placed between a pair of electrodes by application of a voltage exceeding a threshold value. The respective states can be retained (or memorized) without application of a voltage.

The recording medium 103 may also be made of a material which changes the surface state to be convex or concave by local melting or local evaporation by application of a voltage higher than a threshold value, such as a metal film of Au or Pt, and the like.

The method of recording and reproduction is described below.

The recording is conducted by moving the Z-direction coarse-movement piezoelectric element 105 and the probe-driving mechanism 102 by a movement mechanism to a recording position and then applying a voltage exceeding a threshold value onto the recording medium 103. At that time, a bias voltage is applied to the recording medium 103 by a bias circuit 106, and the probes are held at a distance from the recording medium to allow a tunnel current to flow. The probes are brought close to the recording medium by the Z-direction coarse-movement piezoelectric element 105, and then respective probes are brought into the tunnel region by the probe driving mechanism 102. The probe is kept at a predetermined distance from the recording medium by feedback of the tunnel current, which is detected by the tunnel-current-detecting circuit 107, through the Z-direction serve circuit 110 of the respective probe-driving mechanism. In the Z-direction servo circuit 110, a low-pass-filter is provided, and the cut-off frequency is selected so as not to follow the data signal but to follow the swing of the recording medium and waves on the recording medium, thereby the average distance between the probe and the recording medium is controlled to be constant.

At the time of recording, the recording signals are sent from a control circuit 112 to a pulse-applying circuit 108, thereby pulse voltage being applied to respective probes to conduct recording. In the Z direction servo circuit 110, a hold circuit is provided and driving voltage of the probe-driving mechanism 102 to which pulse voltage is applied is maintained so that the pulse application may not cause change of the distance between the probe and the recording medium. Thereby, recording bits are recorded in a matrix form in the recording area of the data lines 104. In the respective recording lines, address information is inserted, which enables discrimination of date on reproduction.

The reproduction is conducted as below.

In reproduction, the probe is moved to the recording area of the desired data line 104, and the difference of the tunnel current flowing between the recording medium 103 and the probe at the recorded portion from that at the non-recording portion is detected. The probe-driving mechanism 102 is controlled by an XY position-controlling circuit 109 so that the probe scans the entire recording area. The reproduction signal in one recording area is passed through a tunnel-current-detecting circuit 107 and is stored temporarily by signal processing in the control circuit 112. Therefrom, desired data only is reproduced and outputted.

In such a recording-reproducing apparatus, the probe-driving mechanism having the constitution of the above Example broadens the region which is scannable with one probe, making one recording area larger, and raising the recording density as a whole.

EXAMPLE 4

An STM apparatus was prepared by use of a cantilever type probe of Example 1. The block diagram of the apparatus is similar to the one of FIG. 5.

With this apparatus, a cleavage face of substrate of HOPG (highly oriented pyrolysis graphite) was observed at the bias current of 1 nA, and the scanning area of 100 Å×100 Å, thereby a satisfactory atomic image being obtained.

The surface of the HOPG substrate having small steps was observed in the same manner as above at a scanning area of 500 Å×500 Å. Thereafter the probe is once removed from the substrate, and then the observation was conducted again, thereby the steps on the surface being observed at the same positions with satisfactory reproductivity.

EXAMPLE 5

Figure 9A:
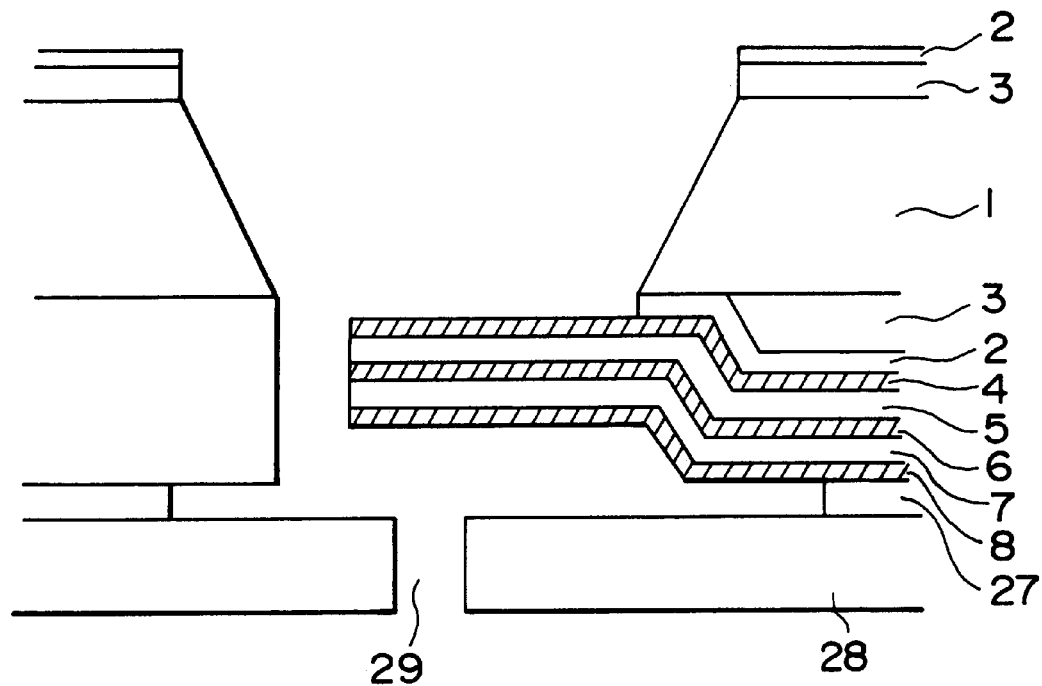
FIGS. 9A and 9B show examples of application of a piezoelectric actuator of the present invention.
Figure 9B:
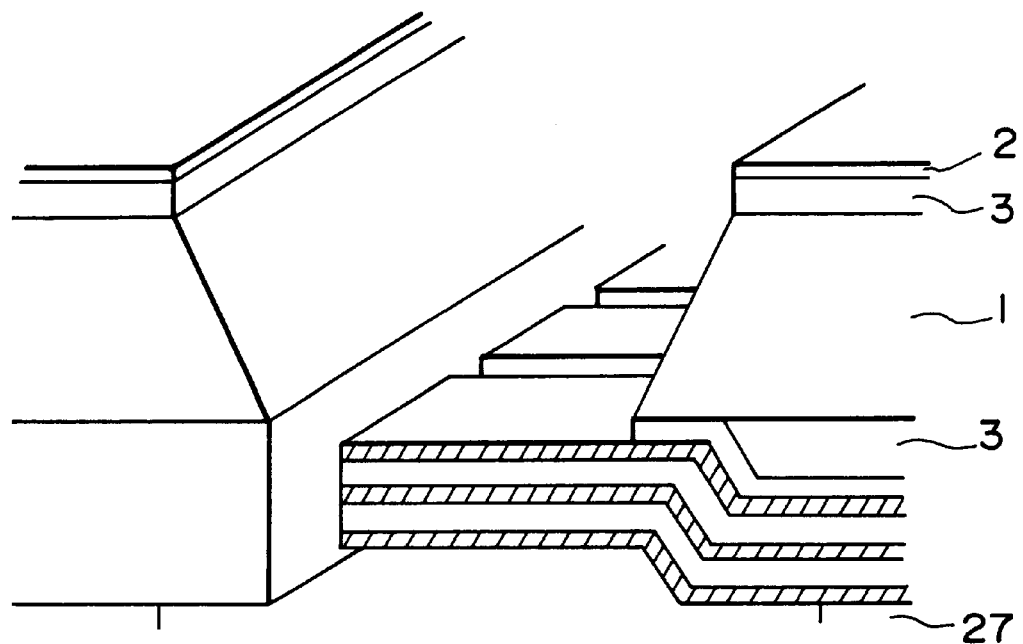

A set of a piezoelectric actuators for an ink-jet head was prepared by juxtaposing a plurality of actuators. The sectional view and the perspective view thereof are roughly illustrated in FIG. 9A and FIG. 9B, respectively.

The piezoelectric actuators were prepared in the same manner as Example 1 immediately before the removal of the substrate except that the tips were not formed. Subsequently, a plurality of nozzle openings 29 were formed on a substrate 28 for nozzles. Further, spacers 27 were formed. The spacers 27 were made of an electroconductive thin plate of a noble metal or the like. The spacers connect upper electrode 8 each other and serve also as leader electrodes. Each lower electrode of the respective piezoelectric actuators was connected to a leader electrode, not shown in the drawing, to apply voltage individually. After registration, the substrate 1 having the piezoelectric actuators and the nozzle substrate 28 were glued together. Finally the substrate at the portions below the piezoelectric actuator was eliminated by anisotropic etching with an aqueous potassium hydroxide as shown in Example 1 except the one side of the end portions of the piezoelectric actuators.

The ink-jet head thus prepared is capable of ejecting ink through the nozzle opening 29 by displacing vertically the free end of the piezoelectric actuator caused by the voltage applied to the lower electrode 4 and thereby increasing the pressure of the ink in the vicinity of the nozzle opening 29. By use of a plurality of actuators to which voltage is applied as above selectively and intermittently, desired printing is practiced with satisfactory responsibility to the voltage application.

In the present invention, the insulating layer between the substrate and the electrode of the cantilever is left remaining only under the wiring portion on the substrate, and thereafter the electrode layer and the piezoelectric layer are laminated. Therefore, the problem of undesired side etching of Si does not arise in the etching of the insulation layer subsequent to the etching of the Si membrane at the cantilever portion. Accordingly, the insulating layer under the wiring can be made thick and thereby the parasitic capacitance between the wiring portions can be decreased, and the rigidity of the cantilever portion can be lowerd. Thus the variation in parasitic capacitances among the probes can be made low, and the values of the parasitic capacitances can be made small, whereby the controllability of the probe driving is remarkably improved. In addition, the driving characteristics of the cantilever is improved.

What is claimed is:

1. A process for producing a probe-driving mechanism, comprising the steps of:

providing a first insulating layer with a thickness of not less than 5000 Å on a first side and a second side of a support comprising silicon;

removing a part of the first insulating layer on the first side and the second side of the support by etching, thereby providing a cantilever region comprising an exposed part of the support;

providing a second insulating layer on the exposed support and the remaining first insulating layer on the first and the second sides of the support;

removing a part of the second insulating layer on the second side of the support corresponding to the cantilever region;

reducing the thickness of the support at the cantilever region by removing a partial layer of the support from the second side of the support, thereby forming a membrane constituting the support having reduced thickness and the second insulating layer on the first side of the support;

laminating a plurality of electrode layers and piezoelectric layers successively on the second insulating layer on the first side of the support; and removing the membrane, thereby forming a cantilever constituting the plurality of electrode layers and piezoelectric layers.

2. The process for producing a probe-driving mechanism according to claim 1, wherein the part of the first insulating layer is removed by isotropic etching.

3. The process for producing a probe-driving mechanism according to claim 1, wherein the part of the support and the second insulating layer is removed by anisotropic etching.

4. The process for producing a probe-driving mechanism according to claim 1, wherein the process further comprises an additional step of forming a probe for information input and output at the end of the cantilever remote from the support.

5. The process for producing a probe-driving mechanism according to claim 1, wherein a layer comprising a silicon oxide film is provided as the first insulating layer.

6. The process for producing a probe-driving mechanism according to claim 1, wherein a layer comprising a silicon nitride film is provided as the second insulating layer.

* * * * *

UNITED STATES PATENT AND TRADEMARK OFFICE
CERTIFICATE OF CORRECTION

PATENT NO. : 5,966,787
DATED : October 19, 1999
INVENTOR(S) : Masaru Kakayama et al.

It is certified that error appears in the above-identified patent and that said Letters Patent is hereby corrected as shown below:

Title page, Item [62],
Related U.S. Application Data, "Feb. 10, 1996" should read -- Feb. 10, 1994 --.

Signed and Sealed this

Sixth Day of November, 2001

Attest:

NICHOLAS P. GODICI
Attesting Officer
Acting Director of the United States Patent and Trademark Office